(12) United States Patent
Aoki (10) Patent No.: US 7,038,953 B2
(45) Date of Patent: May 2, 2006

(54) MEMORY INTERFACE CONTROL CIRCUIT AND MEMORY INTERFACE CONTROL METHOD

(75) Inventor: Mutsumi Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/082,709

(22) Filed: Mar. 18, 2005

(65) Prior Publication Data

US 2005/0213396 A1    Sep. 29, 2005

(30) Foreign Application Priority Data

Mar. 26, 2004   (JP)   ............................ 2004-092268

(51) Int. Cl.
*G11C 7/00*   (2006.01)
(52) U.S. Cl. .................. 365/189.05; 365/194; 365/195
(58) Field of Classification Search ........... 365/189.05, 365/194, 195, 238.5; 710/305
See application file for complete search history.

(56) References Cited

U.S. PATENT DOCUMENTS

| | | | |
|---|---|---|---|
| 6,407,963 B1 | 6/2002 | Sonoda et al. | |
| 6,529,993 B1 * | 3/2003 | Rogers et al. | ............... 711/105 |
| 6,680,869 B1 | 1/2004 | Sonoda et al. | |
| 6,708,245 B1 * | 3/2004 | Okuda | ......................... 710/305 |
| 2002/0118575 A1 | 8/2002 | Sonoda et al. | |
| 2003/0031081 A1 | 2/2003 | Suzuki et al. | |

FOREIGN PATENT DOCUMENTS

| | | |
|---|---|---|
| JP | 2001-189078 | 7/2001 |
| JP | 2003-050739 | 2/2003 |
| JP | 2003-059267 | 2/2003 |
| JP | 2003-173290 | 6/2003 |

* cited by examiner

*Primary Examiner*—Son T. Dinh
(74) *Attorney, Agent, or Firm*—Foley & Lardner LLP (57) ABSTRACT

According to one embodiment, one variable delay circuit adjusts a data strobe signal to be delayed, a control circuit generates an auxiliary signal, another variable delay circuit adjusts the auxiliary signal to be delayed, a mask generation circuit generates a mask signal based on the delayed data strobe signal and the delayed auxiliary signal, and an AND circuit applies the mask signal to the delayed data strobe signal, thereby generating a data strobe signal without a glitch. A write address signal generation circuit generates a control signal for controlling a flip-flop group based on the data strobe signal without the glitch, and the flip-flop group stores read data according to the control signal. A selector selects data from among pieces of data stored in the flip-flop group according to the read address signal.

12 Claims, 11 Drawing Sheets

MEMORY INTERFACE CONTROL CIRCUIT AND MEMORY INTERFACE CONTROL METHOD

BACKGROUND OF THE INVENTION

1. Field of the Invention

The present invention relates to a memory interface control circuit and memory interface control method for reading data from a memory. More specifically, the present invention relates to a memory interface control circuit and memory interface control method for reading data from a double data rate 2-synchronous random access memory (hereinafter, "DDR2-SDRAM").

2. Description of the Related Art

DDR-SDRAM has experienced substantial growth over the past several years. The DDR-SDRAM is a synchronous dynamic random access memory ("synchronous DRAM" or "SDRAM") having a high-rate data transfer function called "double data rate ("DDR") mode". In the DDR mode, data can be read and written at both rising and falling of a clock signal which is provided for synchronizing respective circuits in a computer.

The DDR-SDRM inputs and outputs data at a frequency twice as high as that of an external clock, so that a width of definitely set data is smaller than that for a single data rate SDRAM ("SDR SDRAM"). If the wiring lengths from the memory (DDR SDRM) to a controller are different, time required until data reaches to a receiver (flight time) is also different, thereby, it is difficult to determine a timing at which the receiver accepts data. The DDR-SDRAM adopts a data strobe signal ("DQS") to notify the receiver of a data transfer timing. The DQS is a bidirectional strobe signal and functions as a data input and output operation reference clock in both read and write operations.

Figure 1:
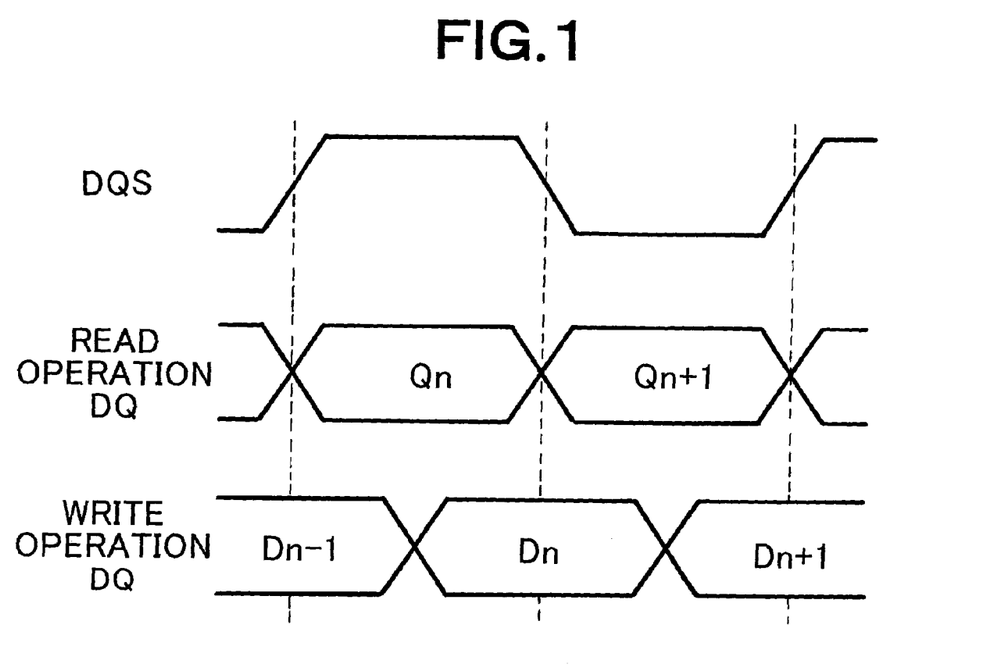
FIG. 1 depicts a relative timing relationship between a data strobe signal and data for a DDR-SDRAM.

As shown in FIG. 1, in the read operation, an edge of the DQS coincides with an edge of read data. In the write operation, the edge of the DQS is located at the center of write data. If the controller receives the read data from the DDR-SDRAM, the received DQS is delayed and shifted to the center of the read data within the DDR-SDRAM.

The DQS in a read cycle will next be described.

In the read cycle, the DDR-SDRAM controls the DQS synchronized with a clock (CLK). The receiver accepts data (DQ) based on the DQS. The DQS operates in the read cycle as follows.

Figure 3:
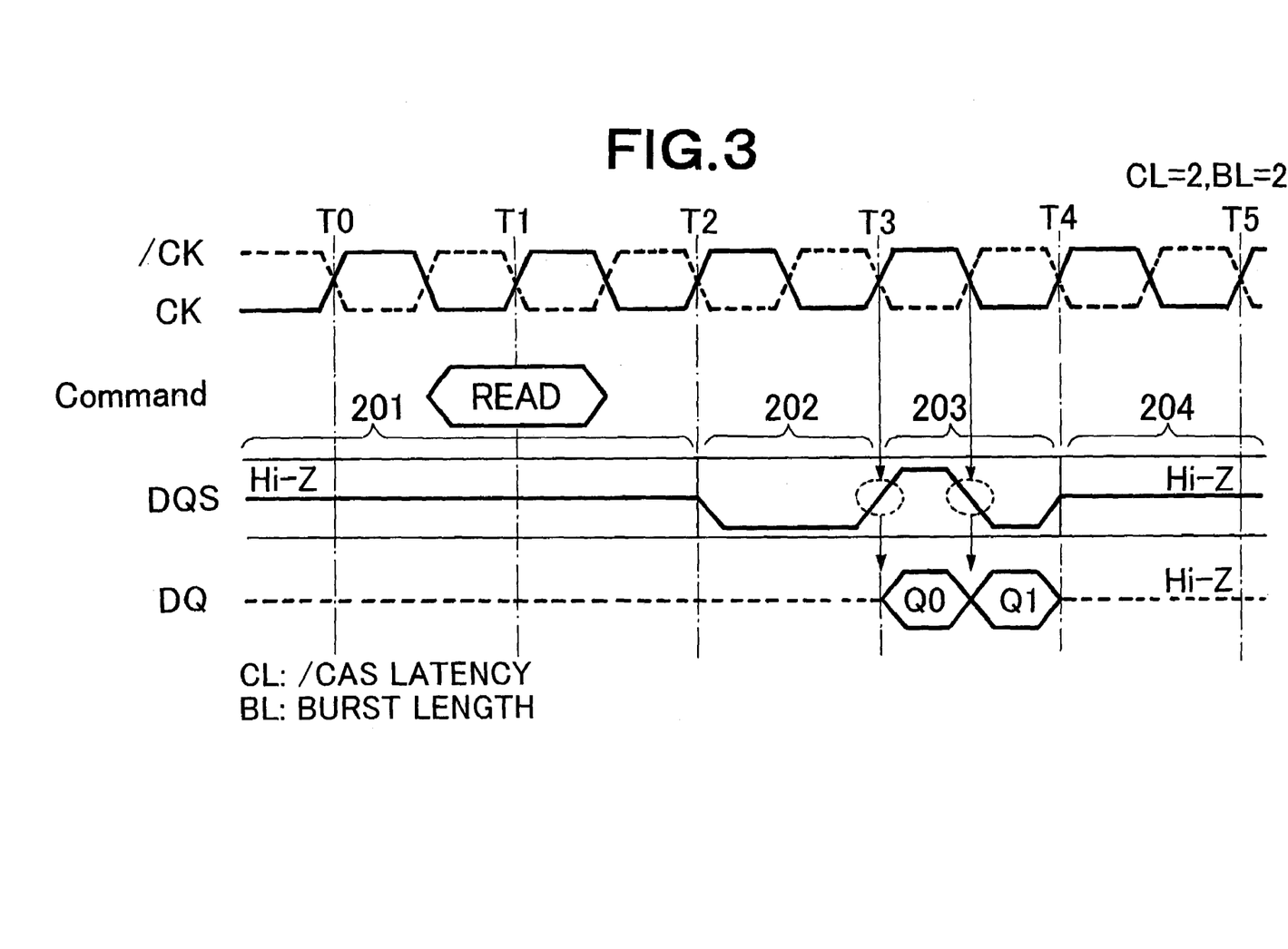
FIG. 3 is another timing chart depicts waveforms of the data strobe signal of the DDR-SDRAM.

(1) While data (DQ) is not output, the DQS is in a high impedance state (indicated by "201" in FIG. 3.

(2) After a read command (READ) is input, the DQS turns into a low level about one clock before the data DQ is output (indicated by "202" in FIG. 3).

(3) When effective data starts to be output from the memory, the DQS starts to toggle at the same frequency as that of the CLK and continues to toggle until burst read is finished (indicated by "203" in FIG. 3). In the example of FIG. 3, effective data in the form of burst data corresponding to two time slots (Q0 and Q1) are present, and the DQS toggles twice, accordingly.

(4) When the burst read is finished, the DQS returns to the high impedance state.

Figure 2:
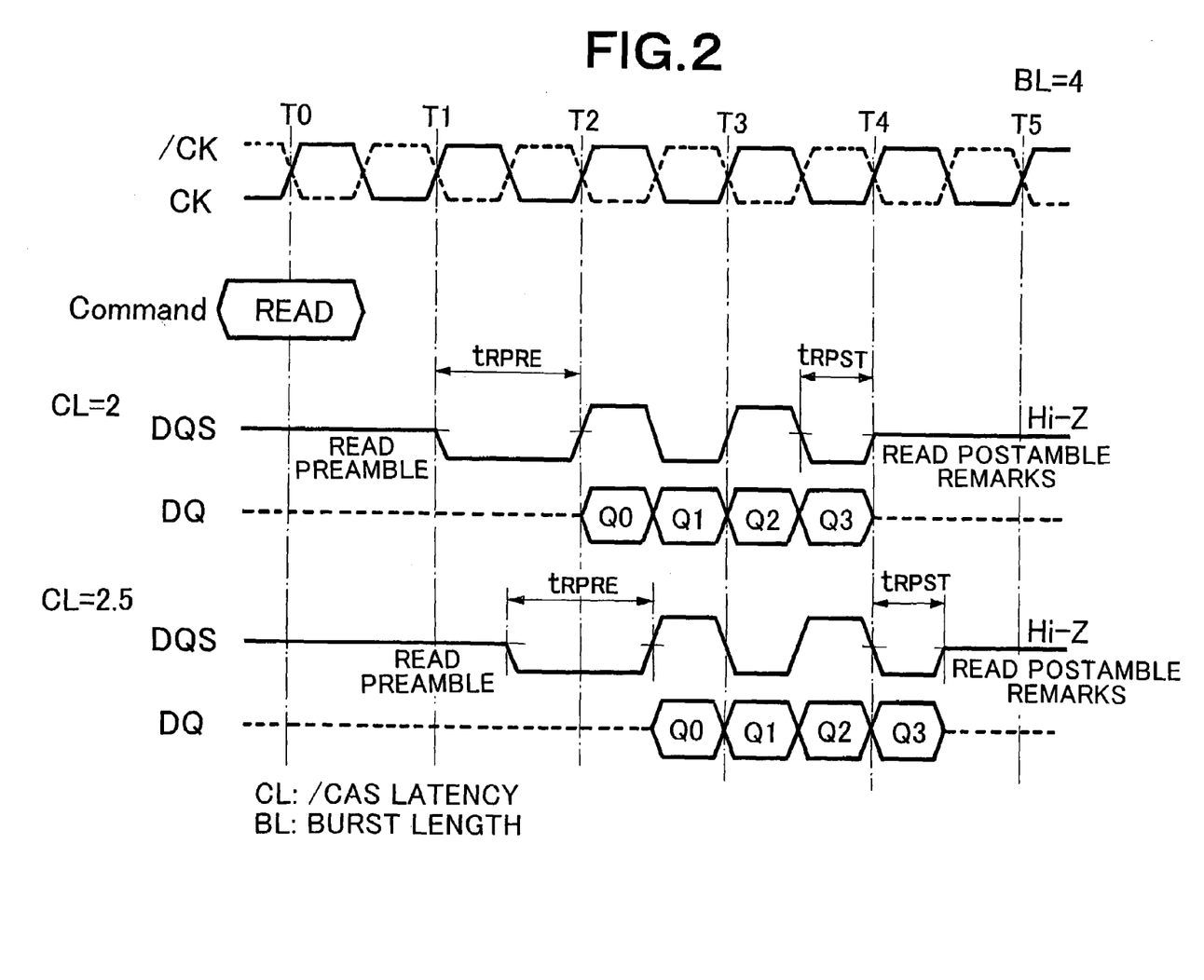
FIG. 2 is a timing chart that depicts waveforms of the data strobe signal of the DDR-SDRAM.

As shown in FIG. 2, a data strobe pattern in the read operation consists of a preamble state, a toggle state, and a postamble state.

If the DDR-SDRAM receives the read command (READ) in a bank active state, the DQS changes from the high impedance state to a low level. This low level corresponds to a read preamble state. The read preamble state appears about one clock before first data is output. Following the read preamble state, the DQS toggles at the same frequency as that of the clock CLK while m data has effective data on a data input and output terminal (DQ). After last data is transferred, a low-level period corresponding to a read postamble state starts. The read postamble state continues for a time of about a half clock since an edge of the last data appears.

The DQS changes from the high impedance state to the preamble state, and changes from the postamble state to the high impedance state. In a transition period from the postamble state to the high impedance state, a glitch noise is generated due to signal reflection.

Figure 4:
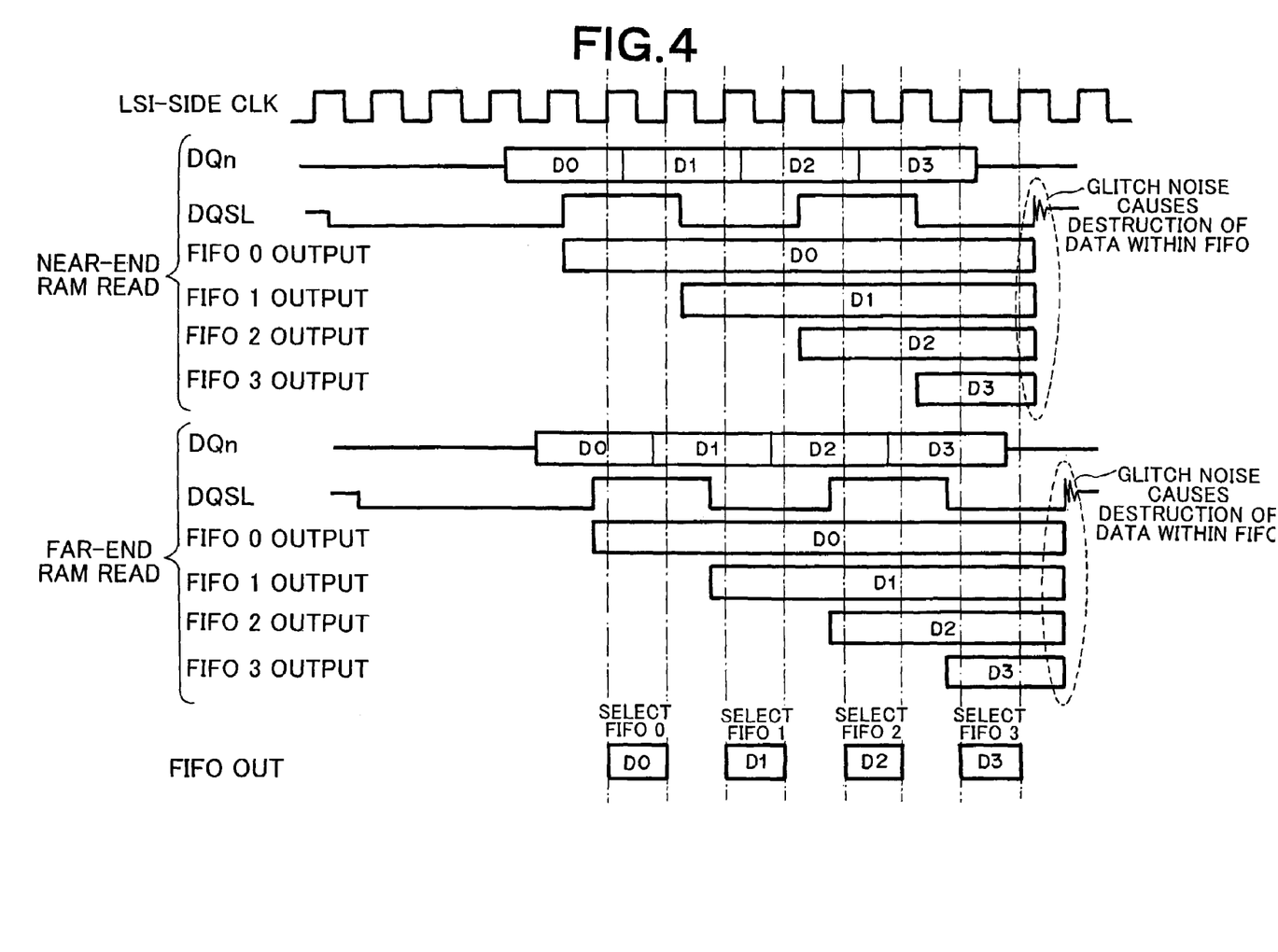
FIG. 4 is a timing chart that depicts a conventional method for reading data from a DDR-SDRAM.

An operation of a conventional DDR-SDRAM interface will be described with reference to FIG. 4. In the conventional DDR-SDRM, the glitch noise causes destruction of data in a first-in first-out (FIFO) buffer serving as an output buffer. However, since a transfer frequency is lower than an LSI-side clock CLK, synchronization can be still established.

Prior art literatures relating to the present invention are as follows: JPA 2001-189078, JPA 2003-050739, JPA 2003-059267 and JPA 2003-173290.

As a next-generation memory to the DDR-SDRAM, a double data rate 2-synchronous random access memory ("DDR2-SDRAM") has appeared.

The DDR2-SDRAM differs from the DDR-SDRAM in the following respects. A package of DDR2-SDRAM is FBGA, while that of the DDR-SDRAM is TSOP. A power supply voltage of DDR2-SDRAM is 1.8 volts, while that of the DDR-SDRAM is 2.5 volts. A maximum capacity of DDR2-SDRAM is 2 gigabytes (Gbyte), while that of the DDR-SDRAM is 1 Gbyte. The number of internal banks of DDR2-SDRAM is 4 or 8, while that of the DDR-SDRAM is 4. An operating speed of DDR2-SDRAM is twice as high as that of the DDR-SDRAM. A signal terminating end of DDR2-SDRAM is a chip while that of the DDR-SDRAM is a mother board.

Figure 5:
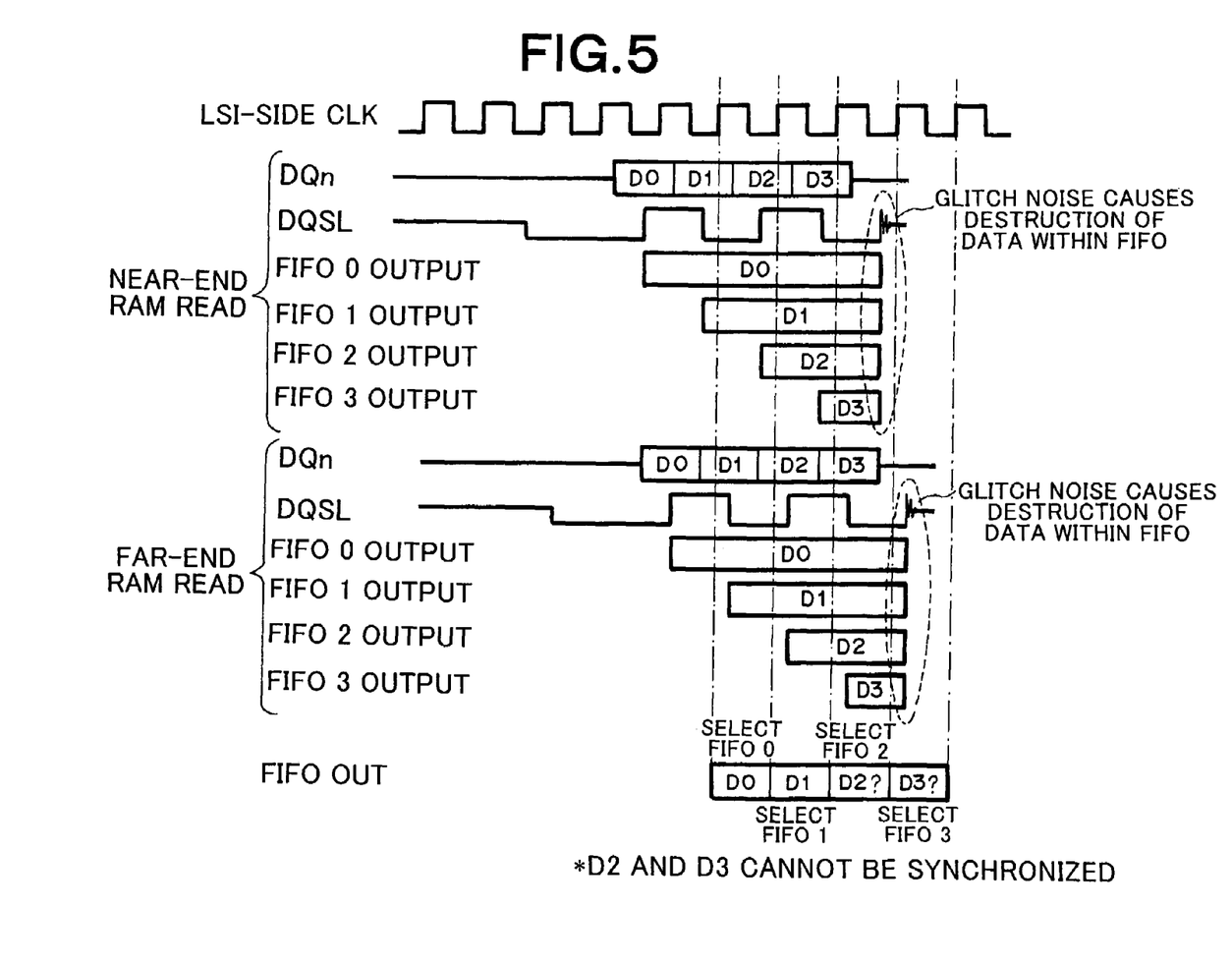
FIG. 5 is a timing chart that depicts a conventional method for reading data from a DDR2-SDRAM.

Since the transfer frequency of the DDR2-SDRAM is twice as high as that of the DDR-SDRAM, synchronization cannot be established without processing data as shown in FIG. 5. Thus, each wiring length is set so that data can be transferred satisfactorily even if a glitch noise is superimposed on the data, and placement of a plurality of RAMs is restricted. Even if the mask is set at a specific timing to prevent the glitch noise from being superimposed on the DQS, the placement of a plurality of RAMs are still restricted.

The conventionally used DDR-SDRAM has a low transfer frequency. Due to this, as shown in FIG. 4, even if the glitch noise is superimposed on the data while the data is changed to the high impedance state, a window for accepting data is still present. However, since the transfer frequency of the DDR2-SDRM is twice as high as that of the DDR-SDRAM, the window for synchronizing data, as shown in FIG. 5, is not present.

SUMMARY OF THE INVENTION

It is an object of the present invention to provide a memory interface control circuit and memory interface control method capable of relaxing a RAM placement restriction and ensuring a high glitch noise resistance.

According to a first aspect of the present invention, there is provided a memory interface control circuit for reading data in each time slot belonging to a burst data from a memory, the memory outputting the burst data after an elapsed predetermined delay time from inputting a read command, the memory also outputting a data strobe signal, the data strobe signal being in preamble state in a period which starts after the memory inputs the read command and ends just before the memory starts to output the burst data, the data strobe signal being in toggle state in output period when the memory outputs the burst data, the data strobe signal toggling every time slot in the output period, the data strobe signal being in postamble state just after the output period, the memory interface control circuit comprising: a secondary data strobe signal generating circuit which generates, on the basis of the data strobe signal, a secondary data strobe signal which toggles when the data in each time slot belonging to the burst data is stable and which maintains the level of a time when the toggling is completed until at earliest a time when reading data in all time slots stored temporarily in a buffer circuit is completed; and the buffer circuit for temporarily storing data of all time slots belonging to the burst data by using the secondary data strobe signal.

In the memory interface control circuit, the secondary data strobe signal generating circuit may comprise: a delay circuit for delaying the data strobe signal; a mask circuit for generating a mask signal on the basis of the delayed data strobe signal; and a logical circuit for generating the secondary data strobe signal by applying the mask signal to the delayed data strobe signal.

The memory interface control circuit may further comprising: an auxiliary signal generating circuit for generating an auxiliary signal, the auxiliary signal causing the mask signal to change from a disable level to an enable level in a period ranging from a moment when a preamble period of the delayed data strobe signal starts to a moment when a toggle period of the delayed data strobe signal starts, and the auxiliary signal also restricting a period in which the mask signal is kept in the enable level, wherein the mask circuit may generate the mask signal on the basis of not only the delayed data strobe signal but also the auxiliary signal.

In the memory interface control circuit, the mask circuit may comprise a first D-type flip-flop circuit, a second D-type flip-flop circuit, a logical AND gate and a logical OR gate, wherein the first D-type flip-flop circuit may use an inverted signal of the secondary data strobe signal as a clock signal thereof, and uses an inverted output signal thereof as an input signal thereof, wherein the second D-type flip-flop circuit may use the inverted signal of the secondary data strobe signal as a clock signal thereof, and uses an output signal of the logical AND gate as an input signal thereof, wherein the logical AND gate may use the auxiliary signal as a first input signal thereof, and uses the inverted output signal of the first D-type flip-flop circuit as a second input signal thereof, and wherein the logical OR gate may use the auxiliary signal as a first input signal thereof, and uses an non-inverting output signal of the second D-type flip-flop circuit as a second input signal thereof, and an output signal of the logical OR circuit may be used as the mask signal.

The memory interface control circuit may further comprise a control circuit for adjusting a delay time of the delay circuit using a calibration pattern.

The memory interface control circuit may further comprise: a first frequency divider for generating a first frequency-divided signal of the secondary data strobe signal by using a rising edge of the secondary strobe signal; and a second frequency divider for generating a second frequency-divided signal of the secondary data strobe signal by using a falling edge of the secondary strobe signal, wherein the buffer circuit may comprise a D-type flip-flop group which uses the first and second frequency-divided signals as clock enable signals thereof, uses the secondary data strobe signal as clock signal thereof, and temporarily stores data of all time slots belonging toe the burst data.

According to a second aspect of the present invention, there is provided a memory interface control method for reading data in each time slot belonging to a burst data from a memory, the memory outputting the burst data after an elapsed predetermined delay time from inputting a read command, the memory also outputting a data strobe signal, the data strobe signal being in preamble state in a period which starts after the memory inputs the read command and ends just before the memory starts to output the burst data, the data strobe signal being in toggle state in output period when the memory outputs the burst data, the data strobe signal toggling every time slot in the output period, the data strobe signal being in postamble state just after the output period, the memory interface control method comprising the steps of causing a secondary data strobe signal generating circuit to generate, on the basis of the data strobe signal, a secondary data strobe signal which toggles when the data in each time slot belonging to the burst data is stable and which maintains the level of a time when the toggling is completed until at earliest a time when reading data in all time slots stored temporarily in a buffer circuit is completed; and causing the buffer circuit to temporarily store data of all time slots belonging to the burst data by using the secondary data strobe signal.

In the memory interface control method, the step of causing the secondary data strobe signal generating circuit to generate the secondary data strobe signal may comprise the steps of causing a delay circuit to delay the data strobe signal; causing a mask circuit to generate a mask signal on the basis of the delayed data strobe signal; and causing a logical circuit to generate the secondary data strobe signal by applying the mask signal to the delayed data strobe signal.

The memory interface control method may further comprise the steps of causing an auxiliary signal generating circuit to generate an auxiliary signal, the auxiliary signal causing the mask signal to change from a disable level to an enable level in a period ranging from a moment when a preamble period of the delayed data strobe signal starts to a moment when a toggle period of the delayed data strobe signal starts, and the auxiliary signal also restricting a period in which the mask signal is kept in the enable level, wherein the mask circuit may generate the mask signal on the basis of not only the delayed data strobe signal but also the auxiliary signal.

In the memory interface control method, the mask circuit may comprise a first D-type flip-flop circuit, a second D-type flip-flop circuit, a logical AND gate and a logical OR gate, wherein the first D-type flip-flop circuit may use an inverted signal of the secondary data strobe signal as a clock signal thereof, and uses an inverted output signal thereof as an input signal thereof, wherein the second D-type flip-flop circuit may use the inverted signal of the secondary data strobe signal as a clock signal thereof, and uses an output signal of the logical AND gate as an input signal thereof, wherein the logical AND gate may use the auxiliary signal as a first input signal thereof, and uses the inverted output signal of the first D-type flip-flop circuit as a second input signal thereof, and wherein the logical OR gate may use the auxiliary signal as a first input signal thereof, and uses an non-inverting output signal of the second D-type flip-flop circuit as a second input signal thereof, and wherein an output signal of the logical OR circuit may be used as the mask signal.

The memory interface control method may further comprise the step of causing a control circuit to adjust a delay time of the delay circuit using a calibration pattern.

The memory interface control method may further comprise the steps of causing a first frequency divider to generate a first frequency-divided signal of the secondary data strobe signal by using a rising edge of the secondary strobe signal; and causing a second frequency divider to generate a second frequency-divided signal of the secondary data strobe signal by using a falling edge of the secondary strobe signal, wherein the buffer circuit may comprise a D-type flip-flop group which uses the first and second frequency-divided signals as clock enable signals thereof, uses the secondary data strobe signal as clock signal thereof, and temporarily stores data of all time slots belonging toe the burst data.

DESCRIPTION OF THE PREFERRED EMBODIMENT

A preferred embodiment of the present invention will be described hereinafter in detail with reference to the accompanying drawings.

The present invention is characterized in that a glitch noise resistance of a data strobe signal (DQS) can be improved in data transfer between a memory (particularly a DDR2-SDRAM) and a LSI, and in that a physical placement restriction relative to the LSI with which the memory performs the data transfer.

Figure 6:
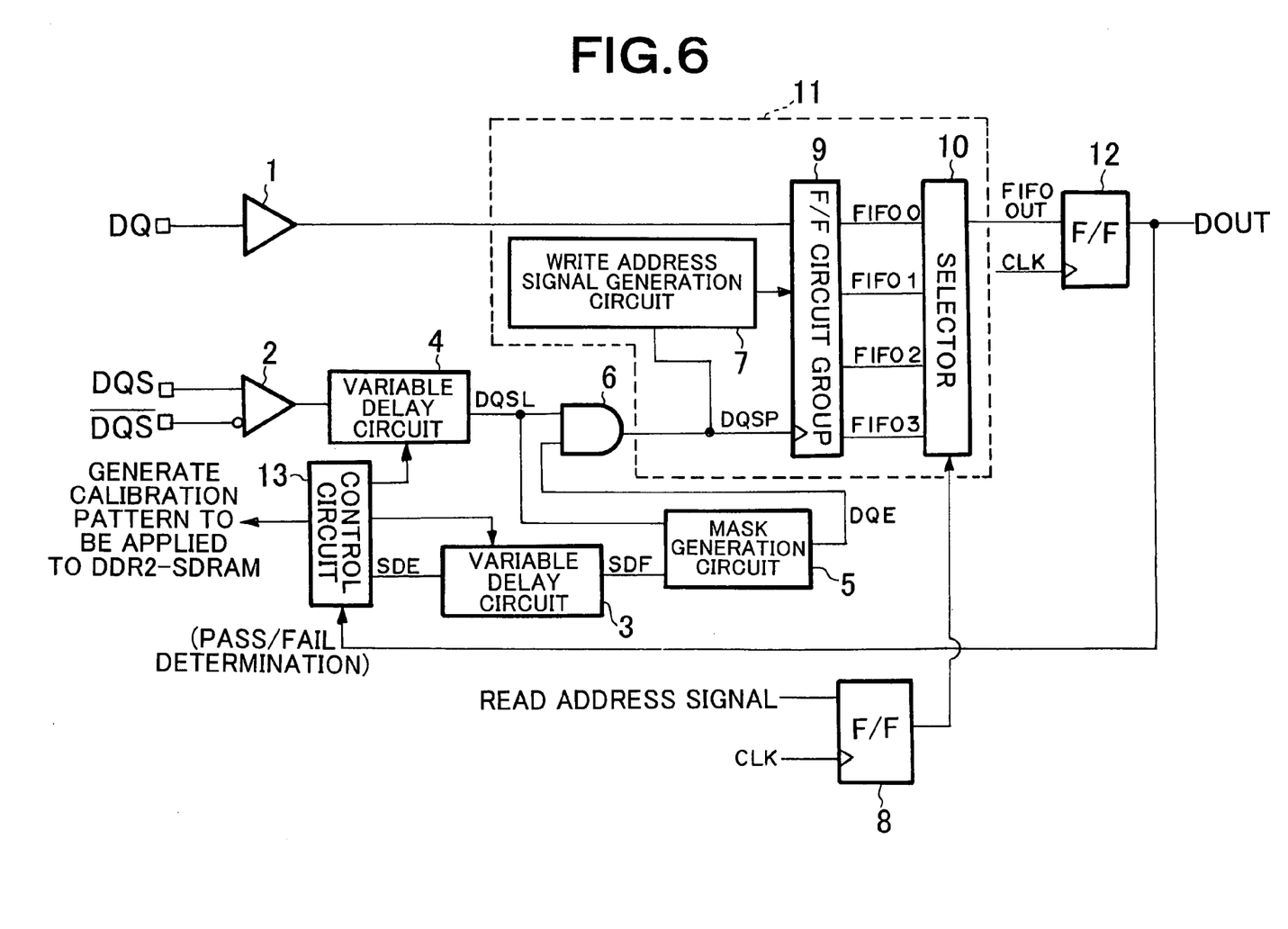
FIG. 6 is a block diagram that depicts a configuration of a memory interface control circuit according to an embodiment of the present invention.

FIG. 6 is a block diagram that depicts a configuration of a memory interface control circuit according to the embodiment of the present invention. In FIG. 6, an I/O buffer 1 is an input buffer that receives data read from the DDR-SDRAM. An I/O buffer 2 is an input buffer that receives a data strobe signal DQS read from the SDR2-SDRAM. The data strobe signal DQS is a balance input/output in the SDR2-SDRAM. Although the I/O buffers 1 and 2 are originally bidirectional buffers, they are illustrates as input buffers since this embodiment relates to an input side of the memory interface control circuit. A variable delay circuit 3 adjusts a transition timing of a basic mask signal SDE output from a control circuit 13 to an optimum value by a delay control signal output from the control circuit 13. The data strobe signal DQS is output from the DDR2-SDRAM with an equal phase to that of a data signal DQ. Due to this, if the data strobe signal DQS is output without being processed, it is difficult to determine a timing for receiving the data (a window for receiving the data is not present). To solve this disadvantage, a variable delay circuit 4 is provided to execute a control of shifting the phase of the data strobe signal DQS by a half cycle of a clock CLK. A mask generation circuit 5 generates a mask signal DQE from a basic mask signal SDF obtained by adjusting the basic mask signal SDE to be delayed by the variable delay circuit 3, and a data strobe signal DQSL obtained by adjusting the data strobe signal DQS to be delayed by the variable delay circuit 4. An AND circuit 6 performs a logical AND operation between the mask signal DQE generated by the mask generation circuit 5 and the data strobe signal DQSL, thereby generating a data strobe signal DQSP obtained by removing a glitch noise from the data strobe signal DQSL. A write address signal generation circuit 7 generates a write address signal for controlling an order of writing data to a flip-flop (F/F) circuit group 9 based on the data strobe signal DQSP. The write address signal generation circuit 7, the F/F circuit group 9, and a selector 10 function as a first-in first-out (FIFO) circuit 11 as a whole. A F/F 8 synchronizes a read address signal for controlling the selector 10 with the clock CLK. A F/F 12 synchronizes a FIFO OUT signal output from the FIFO 11 with the clock CLK. It is noted that the read address signal is a device logical signal of a large-scale integrated circuit (LSI) in which the interface control circuit according to this embodiment is mounted. The control circuit 13 includes a function of generating the basic mask signal SDE that is the basic mask signal which will be subjected to a delay adjustment, a function of controlling the variable delay circuit 3, and a function of controlling the variable delay circuit 4. In addition, the control circuit 13 includes a pattern generation function of generating a pattern for a calibration to be applied to the DDR2-SDRAM. When the device is initialized, the control circuit 3 makes a PASS/FAIL determination with this pattern set as an expected value, and performs a calibration between the delay circuits 3 and 4.

As can be seen, according to this embodiment, the mask is set to the data strobe signal unless it is necessary to do so. A glitch noise resistance of the data strobe signal can be, therefore, improved. Further, since the variable delay circuits 3 and 4 are provided, a glitch noise masking function of absorbing a delay difference resulting from a difference in physical placement of the DDR2-SDRAMs relative to the LSI with which the DDR2-SDRAMs perform data transfers can be provided.

Figure 7:
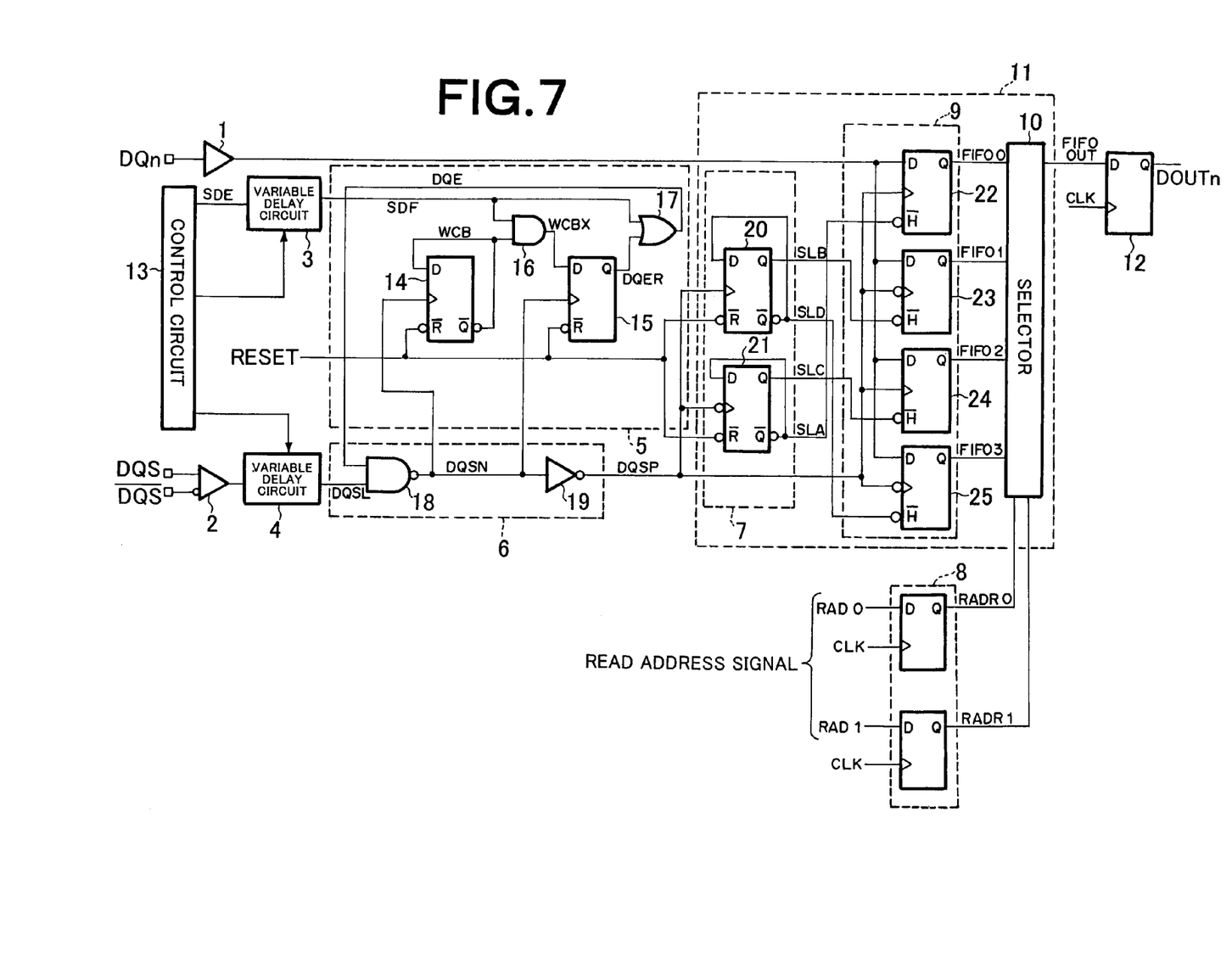
FIG. 7 is a circuit diagram that depicts the configuration of the memory interface control circuit according to the embodiment of the present invention.

FIG. 7 is a circuit diagram that depicts the configuration of the memory interface control circuit as one embodiment of the present invention. In FIG. 7, the I/O buffer 1 is the input buffer that receives data DQn read from the DDR2-SDRAM. The I/O buffer 2 is the input buffer that receives the data strobe signal DQS read from the DDR2-SDRM. The data strobe signal is a balance input/output in the DDR2-

SDRAM. Although the I/O buffers 1 and 2 are originally bidirectional buffers, they are illustrates as input buffers since this embodiment relates to an input side of the memory interface control circuit. The variable delay circuit 3 adjusts the transition timing of the basic mask signal SDE output from the control circuit 13 to the optimum timing by a delay control signal output from the control circuit 13. A basic mask signal SDE is generated based on a timing of the read command. The data strobe signal DQS is output from the DDR2-SDRAM with an equal phase to that of the data signal DQ. Due to this, if the data strobe signal DQS is output without being processed, it is difficult to determine the timing for receiving the data (a window for receiving the data is not present). To solve this disadvantage, the variable delay circuit 4 is provided to execute a control of shifting the phase of the data strobe signal DQS by a half cycle of the clock CLK. The mask generation circuit 5 generates the mask signal DQE from the basic mask signal SDF obtained by adjusting the basic mask signal SDE to be delayed by the variable delay circuit 3, and the data strobe signal DQSL obtained by adjusting the data strobe signal DQS to be delayed by the variable delay circuit 4. The AND circuit 6 applies the mask signal DQE generated by the mask generation circuit 5 to the data strobe signal DQSL, thereby generating the data strobe signal DQSP obtained by removing a glitch noise from the data strobe signal DQSL. The write address signal generation circuit 7 generates four write address signals for controlling the order of writing data to the F/F circuit group 9 based on the data strobe signal DQSP. In this embodiment, the write address signal generation circuit 7, the F/F circuit group 9, and the 4-to-1 selector 10 function as the four-stage FIFO circuit 11 as a whole. Sine the F/F circuit group 9 includes four F/F circuits, a read address signal consisting of two bits for controlling the 4-to-1 selector 10 are used, the two bits of the read address signal being assumed as "RADR0" and "RADR1", respectively. The selector 10 receives the two bits of the read address signal RADR0 and RADR1. The F/F 12 receives a FIFO OUT signal output from the FIFO circuit 11. The read address signal is a device logical signal of the LSI in which the interface control circuit according to this embodiment is mounted. The control circuit 13 includes the function of generating the basic mask signal SDE that is the basic mask signal which will be subjected to the delay adjustment and that forms a basis for the time-adjusted basic mask signal SDF, the function of controlling a delay time of the variable delay circuit 3, and the function of controlling a delay time of the variable delay circuit 4. In addition, the control circuit 13 includes the pattern generation function of generating a calibration pattern to be applied to the DDR2-SDRAM. When the device is initialized, the control circuit 13 makes a PASS/FAIL determination with this pattern set as an expected value, and performs the calibration of the delay circuits 3 and 4.

The configuration of the memory interface control-circuit according to this embodiment has been described so far in detail with reference to FIG. 7. Since configurations of the variable delay circuits 3 and 4 shown in FIG. 7 are well known to those skilled in the art and are not directly related to this embodiment, detailed configurations of the variable delay circuits 3 and 4 are not shown in FIG. 7.

In addition, as for the control circuit 13, the calibration pattern generation function thereof for applying the pattern to the DDR2-SDRAM is only to write specific data to a specific bit of a specific address. Expected value calibration therefor can be realized by a simple exclusive OR circuit. The basic mask signal SDE is a signal having a logical value "1" only in three cycle periods of the clock and is not particularly difficult to generate. Due to this, a detailed circuit configuration for generating the basic mask signal SDE is not shown in FIG. 7.

Figure 8:
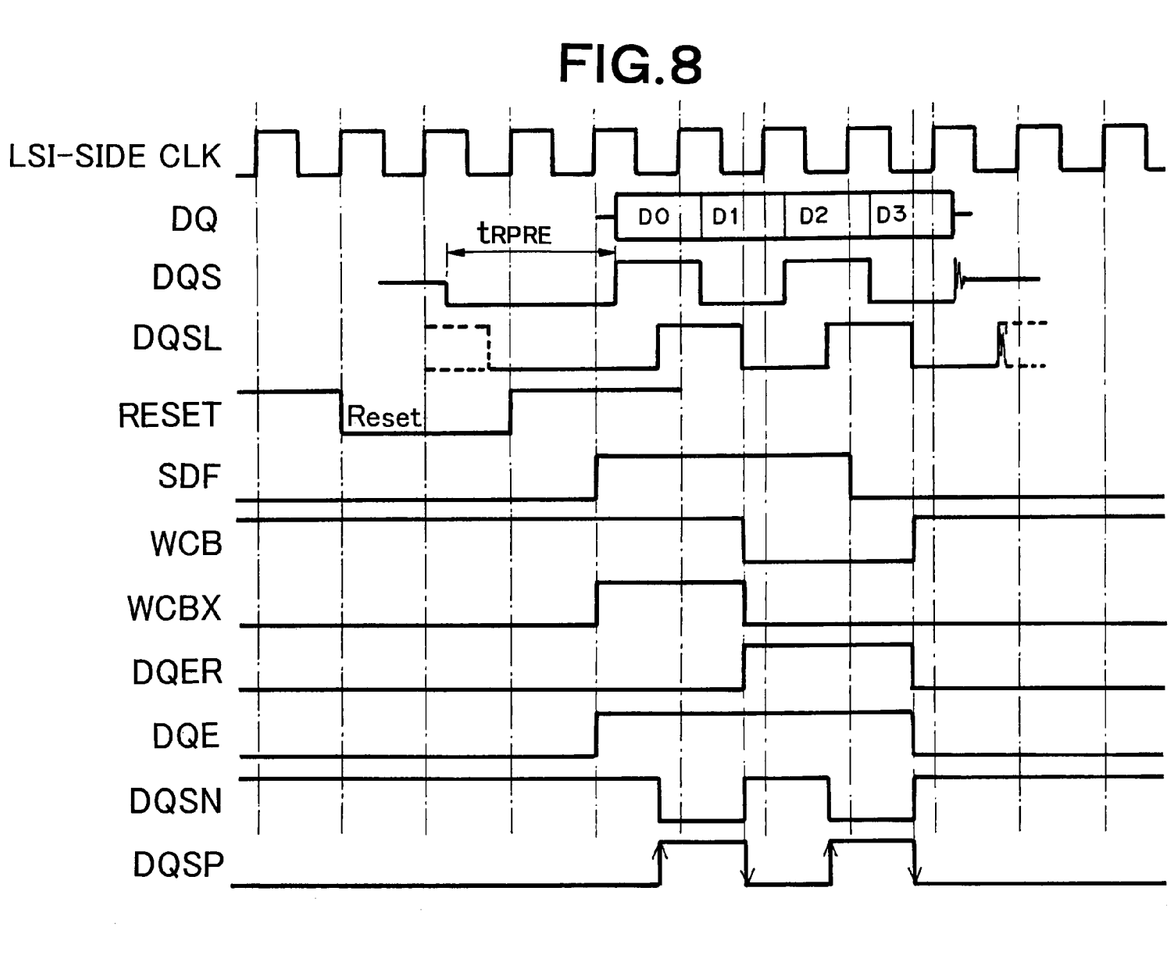
FIG. 8 is a timing chart that depicts a method for reading data from a DDR2-SDRAM according to the embodiment of the present invention.

An operation of the mask generation circuit 5 shown in FIG. 7 will be described with reference to the timing chart shown in FIG. 8. A non-inverted output Q and an inverted output/Q of each of D type F/F circuits 14 and 15 are set at "0" and "1" in advance by a reset signal RESET, respectively. The basic mask signal SDE which will be subjected to the delay adjustment is a signal having a logical value "1" in three cycle periods of the clock CLK. The basic mask signal SDF is a signal which has been subjected to the delay adjustment in the variable delay circuit 3 so as to rise in a period $t_{PRE}$ (read preamble period) in which the data strobe signal DQSL is definitely set to "0", the data strobe signal DQSL having been shifted from the data strobe signal DQS in phase by about the half cycle of the clock CLK. A signal WCBX is generated by causing an AND circuit 16 to perform a logical AND operation between a signal WCB and the delay-adjusted basic mask signal SDF. The signal WCB is an opposite-phase signal to a signal which is obtained by dividing a frequency of a signal DQSN by the D type F/F circuit 14. The signal DQSN is an opposite-phase signal to the data strobe signal DQSL on the assumption that the mask signal DQE is "1". The signal DQER is obtained by synchronizing the signal WCBX with the signal DQSN by a D type F/F 15. Further, the mask signal DQE is generated by causing an OR circuit 17 to perform a logical OR operation between a signal DQER and the delay-adjusted basic signal SDF. In this way, the mask generation circuit 5 generates the mask signal DQE. The mask signal DQE functions to mask data when the DQE has a logical value "0" and to unmask the data when the DQE has a logical value "1". If this mask signal DQE is applied to the delay-adjusted data strobe signal DQSL in inverting output AND circuit 18 and an inverter 19, then the data strobe signal DQSP without a glitch noise is generated. The delay time adjusted by the variable delay circuit 4 is set at an optimum value in light of a delay time between the moment when the data signal DQn is input to the I/O buffer 1 and the moment when the data signal DQn is input to the F/F circuit group 9 as data, and a delay time between the moment when the data stroke signal DQS is input to the I/O buffer 2 and the moment when the data stroke signal DQS is input to the F/F circuit group 9 as a clock. The former delay time includes a transmission line delay time and a gate delay time. The latter delay time includes a delay time of the variable delay circuit 4 as well as the transmission line delay time and the gate delay time. Therefore, by adjusting the delay time of the variable delay circuit 4, a relative relationship of the former to the latter can be adjusted.

Figure 9:
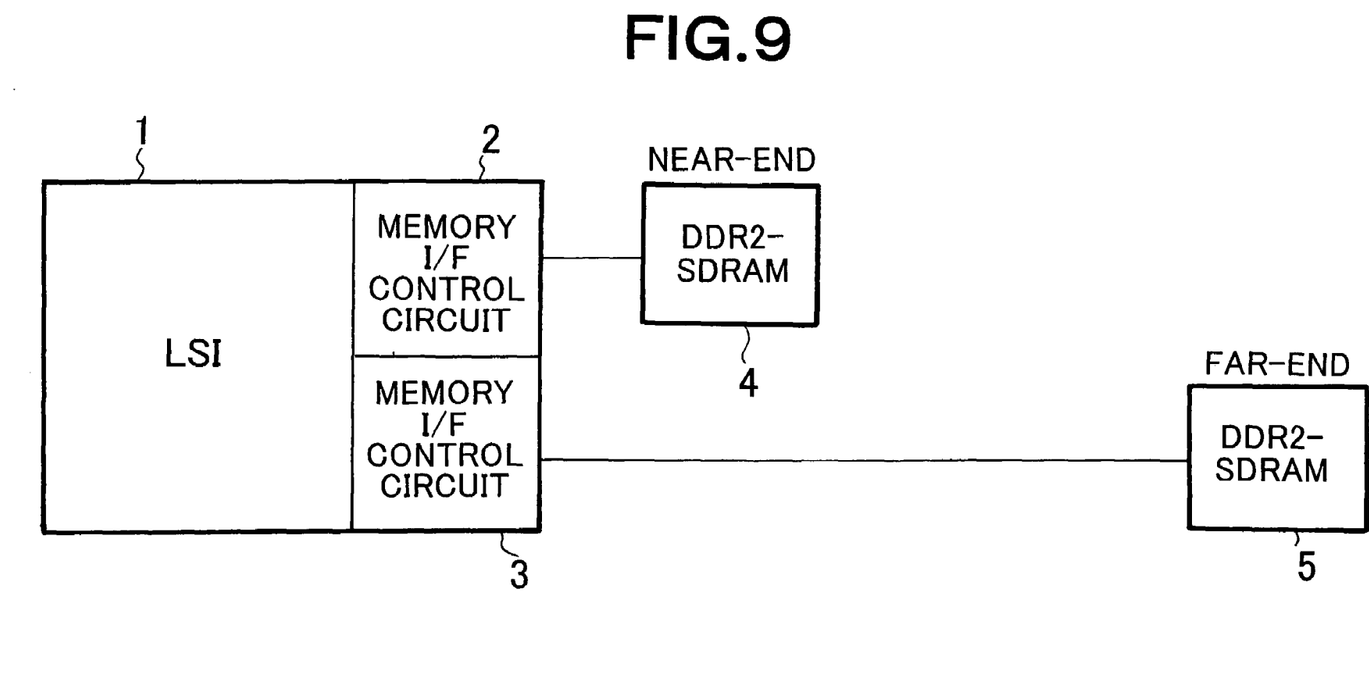
FIG. 9 depicts an instance of locating the DDR2-SDRAM at a position far from a LSI.

Actually and normally, a plurality of memories (DDR2-SDRAMs) are mounted in the LSI. Namely, as shown in FIG. 9, a DDR2-SDRAM 4 is arranged near a LSI 1 in which memory interface control circuits 2 and 3 are mounted, whereas a DDR2-SDRAM 5 is arranged to be far from the LSI 1. Operations of the both memory interface control circuits 2 and 3 according to this embodiment for the DDR2-SDRAMs 4 and 5, respectively will now be described with reference to the timing charts of FIGS. 10 and 11. Since the operation until the data strobe signal DQSP without the glitch noise is generated is equal to that described above, it will not be described herein. Write address signals SLA, SLB, SLC, and SLD are generated by dividing the DQSP at D time flip flops 20, 21. These write address signals SLA, SLB, SLC, and SLD are used as hold signals for the F/F circuit group 9 (D type flip-flops F/F circuits 22, 23, 24, and 25) having a hold function. The hold signal functions as "through" when the signal has a logical value "1" and as "hold" when the signal has a logical value "0". Therefore, the D type F/F circuit 22 stores data D0, the D type F/F circuit 23 stores data D1, the D type F/F circuit 24 stores data D2, and the D type F/F circuit 25 stores data D3. By sequentially reading these pieces of data using the read address signal RADR0 and RADR1, the signal FIFO OUT has a data form shown in the timing charts.

Figure 10:
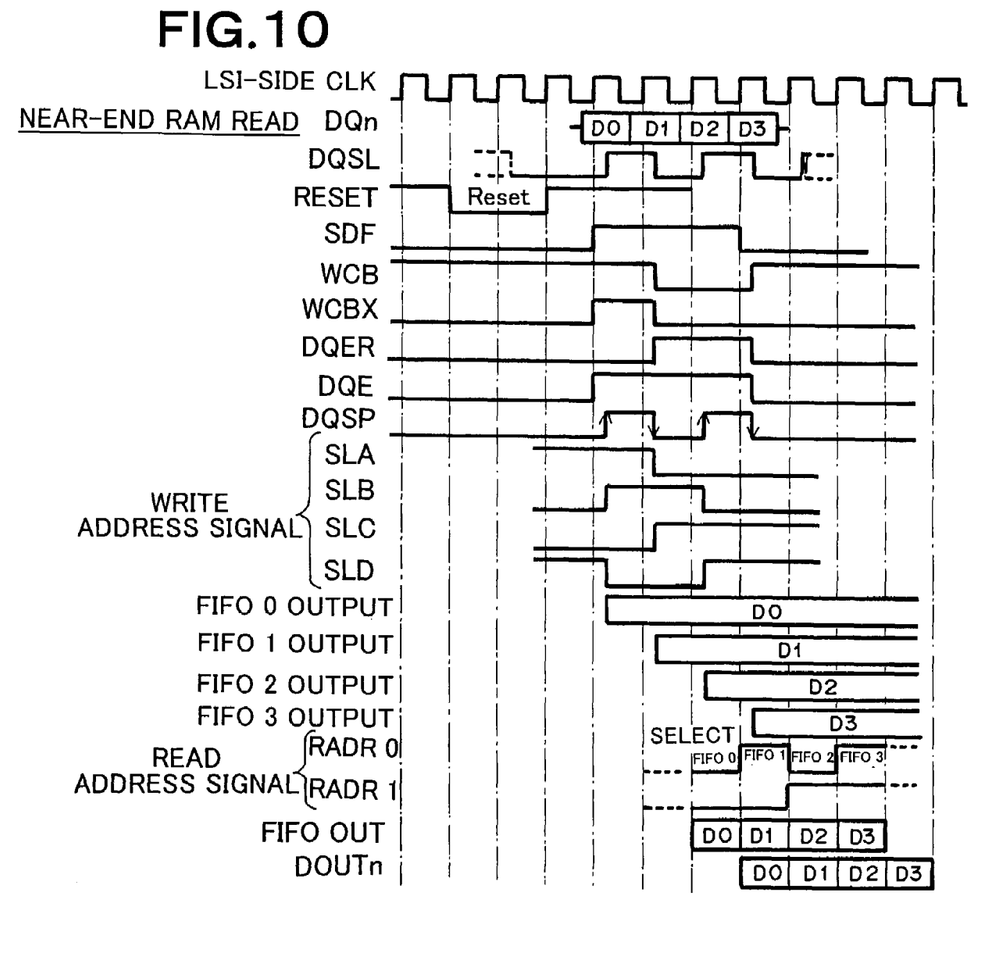
FIG. 10 is a timing chart that depicts a method for reading data from a DDR2-SDRAM arranged on a near end of the LSI according to the embodiment of the present invention.
Figure 11:
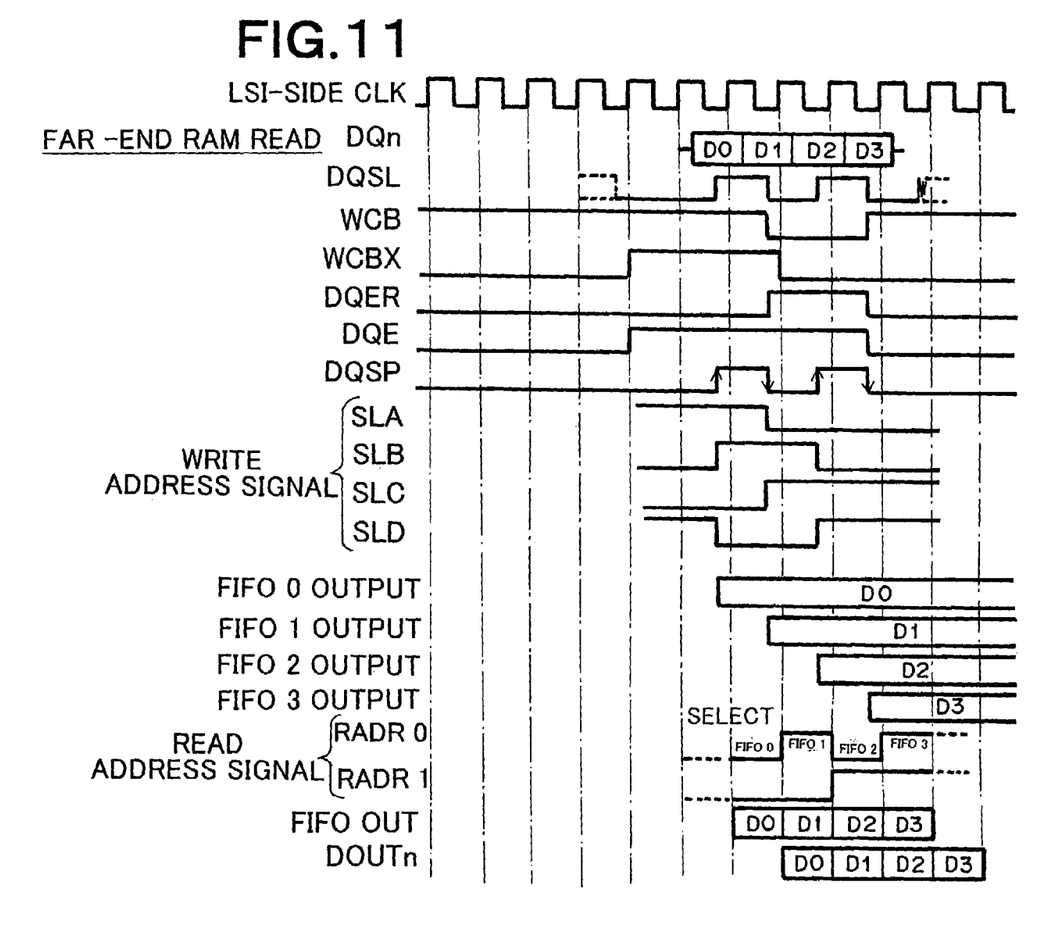
FIG. 11 is a timing chart that depicts a method for reading data from a DDR2-SDRAM arranged on a far end of the LSI according to the embodiment of the present invention.

A time between the moment when the read command is issued and the moment when the read data output from the RAM reaches the LSI in a case where the DDR2-SDRAM is located on a near end of the LSI differs from that in a case where the RAM is located on a distant end thereof as shown in FIGS. 10 and 11. However, by utilizing the memory interface control circuit according to this embodiment, data can be accepted without any problem whether the RAM is near the LSI or far from the LSI.

However, a delay difference between the near-end and far-end needs to be smaller than the read preamble time $t_{RPRE}$. This restriction derives from the need for the mask signal SDF to rise in a period in which the data strobe signal DQSL is definitely set to "0".

In FIG. 7, since the number of data signals DQs may be arbitrarily set according to the number of bits of connected RAMs, the number of data signals DQs is denoted by "n". It is noted, however, the numeric value "n" is normally 4 bits, 8 bits or 16 bits. The variable delay circuit 4 is employed to adjust the phase of the data strobe signal DQS. Alternatively, a fixed delay circuit may be employed in place of the variable delay circuit 4 as long as the FIFO circuit in the receiving-side LSI can accurately sample the signals DQn. Conversely, a delay locked loop (DLL) circuit or the like may be employed so as to strictly make a delay adjustment. Likewise, the variable delay circuit 3 is employed for adjusting the mask signal SDE. As long as the glitch noise can be masked, a fixed delay circuit may be employed in place of the variable delay circuit 3. While the number of entries of FIFO circuit is four in the embodiment of the present invention, the number of entries of FIFO circuit may be two as long as data can be transferred without any problem. If so, it is necessary to change the configuration of the write address signal generation circuit 7 and the number of bits of the read address signal, accordingly.

In the embodiment, the FIFO circuit 11 is constituted to include the write address generation circuit 7, the F/F circuit group 9, and the selector 10 as shown in FIG. 7. Alternatively, the FIFO circuit 11 may be constituted differently from that shown in FIG. 7 as long as the alternative FIFO circuit 11 includes the same functions (by using a counter, for example). The mask generation circuit is constituted as a circuit constitution shown in the reference numeral 5 of FIG. 7. Alternatively, the mask generation circuit may be constituted different from that shown in FIG. 7 as long as the mask generation circuit includes the same functions. Further, in FIG. 7, the F/F circuit 12 that receives the FIFO OUT signal is provided. However, the F/F circuit 12 may be omitted since the FIFO OUT signal itself is already synchronized with the LSI-side clock CLK. Namely, the F/F circuit 12 may be omitted as long as the delay time required until the read address signal reaches to the internal logic through the F/F circuit group 8 and the 4-to-1 selector 10 is sufficiently long.

As stated so far, the present invention can be utilized to read data from the DDR2-SDRAM.

What is claimed is:

1. A memory interface control circuit for reading data in each time slot belonging to a burst data from a memory, said memory outputting said burst data after an elapsed predetermined delay time from inputting a read command, said memory also outputting a data strobe signal, said data strobe signal being in preamble state in a period which starts after said memory inputs said read command and ends just before said memory starts to output said burst data, said data strobe signal being in toggle state in output period when said memory outputs said burst data, said data strobe signal toggling every time slot in said output period, said data strobe signal being in postamble state just after said output period, said memory interface control circuit comprising:

a secondary data strobe signal generating circuit which generates, on the basis of said data strobe signal, a secondary data strobe signal which toggles when said data in each time slot belonging to said burst data is stable and which maintains the level of a time when the toggling is completed until at earliest a time when reading data in all time slots stored temporarily in a buffer circuit is completed; and said buffer circuit for temporarily storing data of all time slots belonging to said burst data by using said secondary data strobe signal.

2. The memory interface control circuit as set forth in claim 1, wherein said secondary data strobe signal generating circuit comprises:

a delay circuit for delaying said data strobe signal;

a mask circuit for generating a mask signal on the basis of the delayed data strobe signal; and a logical circuit for generating said secondary data strobe signal by applying said mask signal to said delayed data strobe signal.

3. The memory interface control circuit as set forth in claim 2, further comprising:

an auxiliary signal generating circuit for generating an auxiliary signal, said auxiliary signal causing said mask signal to change from a disable level to an enable level in a period ranging from a moment when a preamble period of said delayed data strobe signal starts to a moment when a toggle period of said delayed data strobe signal starts, and said auxiliary signal also restricting a period in which said mask signal is kept in said enable level, wherein said mask circuit generates said mask signal on the basis of not only said delayed data strobe signal but also said auxiliary signal.

4. The memory interface control circuit as set forth in claim 3, wherein said mask circuit comprises a first D-type flip-flop circuit, a second D-type flip-flop circuit, a logical AND gate and a logical OR gate, wherein said first D-type flip-flop circuit uses an inverted signal of said secondary data strobe signal as a clock signal thereof, and uses an inverted output signal thereof as an input signal thereof, wherein said second D-type flip-flop circuit uses said inverted signal of said secondary data strobe signal as a clock signal thereof, and uses an output signal of said logical AND gate as an input signal thereof, wherein said logical AND gate uses said auxiliary signal as a first input signal thereof, and uses said inverted output signal of said first D-type flip-flop circuit as a second input signal thereof, and wherein said logical OR gate uses said auxiliary signal as a first input signal thereof, and uses an non-inverting output signal of said second D-type flip-flop circuit as a second input signal thereof, and wherein an output signal of said logical OR circuit is used as said mask signal.

5. The memory interface control circuit as set forth in claim 2, further comprising a control circuit for adjusting a delay time of said delay circuit using a calibration pattern.

6. The memory interface control circuit as set forth in claim 1, further comprising:

a first frequency divider for generating a first frequency-divided signal of said secondary data strobe signal by using a rising edge of said secondary strobe signal; and a second frequency divider for generating a second frequency-divided signal of said secondary data strobe signal by using a falling edge of said secondary strobe signal, wherein said buffer circuit comprises a D-type flip-flop group which uses said first and second frequency-divided signals as clock enable signals thereof, uses said secondary data strobe signal as clock signal thereof, and temporarily stores data of all time slots belonging toe said burst data.

7. A memory interface control method for reading data in each time slot belonging to a burst data from a memory, said memory outputting said burst data after an elapsed predetermined delay time from inputting a read command, said memory also outputting a data strobe signal, said data strobe signal being in preamble state in a period which starts after said memory inputs said read command and ends just before said memory starts to output said burst data, said data strobe signal being in toggle state in output period when said memory outputs said burst data, said data strobe signal toggling every time slot in said output period, said data strobe signal being in postamble state just after said output period, said memory interface control method comprising the steps of:

causing a secondary data strobe signal generating circuit to generate, on the basis of said data strobe signal, a secondary data strobe signal which toggles when said data in each time slot belonging to said burst data is stable and which maintains the level of a time when the toggling is completed until at earliest a time when reading data in all time slots stored temporarily in a buffer circuit is completed; and causing said buffer circuit to temporarily store data of all time slots belonging to said burst data by using said secondary data strobe signal.

8. The memory interface control method as set forth in claim 7, wherein the step of causing said secondary data strobe signal generating circuit to generate said secondary data strobe signal comprises the steps of:

causing a delay circuit to delay said data strobe signal;

causing a mask circuit to generate a mask signal on the basis of the delayed data strobe signal; and causing a logical circuit to generate said secondary data strobe signal by applying said mask signal to said delayed data strobe signal.

9. The memory interface control method as set forth in claim 8, further comprising the steps of:

causing an auxiliary signal generating circuit to generate an auxiliary signal, said auxiliary signal causing said mask signal to change from a disable level to an enable level in a period ranging from a moment when a preamble period of said delayed data strobe signal starts to a moment when a toggle period of said delayed data strobe signal starts, and said auxiliary signal also restricting a period in which said mask signal is kept in said enable level, wherein said mask circuit generates said mask signal on the basis of not only said delayed data strobe signal but also said auxiliary signal.

10. The memory interface control method as set forth in claim 9, wherein said mask circuit comprises a first D-type flip-flop circuit, a second D-type flip-flop circuit, a logical AND gate and a logical OR gate, wherein said first D-type flip-flop circuit uses an inverted signal of said secondary data strobe signal as a clock signal thereof, and uses an inverted output signal thereof as an input signal thereof, wherein said second D-type flip-flop circuit uses said inverted signal of said secondary data strobe signal as a clock signal thereof, and uses an output signal of said logical AND gate as an input signal thereof, wherein said logical AND gate uses said auxiliary signal as a first input signal thereof, and uses said inverted output signal of said first D-type flip-flop circuit as a second input signal thereof, and wherein said logical OR gate uses said auxiliary signal as a first input signal thereof, and uses an non-inverting output signal of said second D-type flip-flop circuit as a second input signal thereof, and wherein an output signal of said logical OR circuit is used as said mask signal.

11. The memory interface control method as set forth in claim 8, further comprising the step of causing a control circuit to adjust a delay time of said delay circuit using a calibration pattern.

12. The memory interface control method as set forth in claim 7, further comprising the steps of:

causing a first frequency divider to generate a first frequency-divided signal of said secondary data strobe signal by using a rising edge of said secondary strobe signal; and causing a second frequency divider to generate a second frequency-divided signal of said secondary data strobe signal by using a falling edge of said secondary strobe signal, wherein said buffer circuit comprises a D-type flip-flop group which uses said first and second frequency-divided signals as clock enable signals thereof, uses said secondary data strobe signal as clock signal thereof, and temporarily stores data of all time slots belonging toe said burst data.

* * * * *